(12) United States Patent
Jung et al.

(10) Patent No.: US 8,637,346 B1
(45) Date of Patent: Jan. 28, 2014

(54) METHOD FOR MANUFACTURING GRAPHENE NANO ARRAY AND FIELD-EFFECT TRANSISTOR INCLUDING THE SAME

(71) Applicant: Gwangju Institute of Science and Technology, Gwangju (KR)

(72) Inventors: Gun Young Jung, Gwangju (KR); Yu Sin Park, Gwangju (KR)

(73) Assignee: Gwangju Institute of Science and Technology, Buk-Gu, Gwangju (KR)

( * ) Notice: Subject to any disclaimer, the term of this patent is extended or adjusted under 35 U.S.C. 154(b) by 0 days.

(21) Appl. No.: 13/693,636

(22) Filed: Dec. 4, 2012

(51) Int. Cl.
*H01L 51/40* (2006.01)

(52) U.S. Cl.
USPC .......................................................... 438/99

(58) Field of Classification Search
None
See application file for complete search history.

(56) References Cited

PUBLICATIONS

Xiaogan Liang et al., Formation of Bandgap and Subbands inGraphene Nanomeshes with Sub-10 nm Ribbon Width Fabricated via Nanoimprint Lithography, Nano Lett. 2010, 10, 2454-2460.*

Bo Cui et al., Fabrication of metal nanoring array by nanoimprint lithography (NIL) and reactive ion etching, Microelectronic Engineering 84 (2007) 1544-1547.*
2012 MRS Spring Meeting & Exhibitors published on Apr. 10, 2012, 15 pages.
Nano Korea 2012, published on Aug. 16, 2012, 3 pages.

* cited by examiner

*Primary Examiner* — Charles Garber
*Assistant Examiner* — Syed Gheyas
(74) *Attorney, Agent, or Firm* — Nath, Goldberg & Meyer; Jerald L. Meyer

(57) ABSTRACT

The present disclosure provides a method for manufacturing a graphene nano array. The method includes: preparing a substrate having a graphene sheet disposed thereon; sequentially forming a protective layer, a sacrificial layer and a resist layer on the graphene sheet; forming a hole pattern in a surface of the resist layer; etching the sacrificial layer and the protective layer along the hole pattern to form a trench such that a portion of the protective layer adjacent to the graphene sheet can remain; forming a metal layer of a nanocup pattern along a sidewall of the trench while rotating the trench; removing a lower surface of the metal layer to form a metal layer in a nanotube pattern; removing the resist layer and the sacrificial layer; etching the protective layer and the graphene sheet adjacent to the protective layer along the nanotube pattern; and removing the protective layer and the metal layer, thereby providing a graphene nano array having a large area at low cost. The graphene nano array may be used as channels of a field-effect transistor.

10 Claims, 6 Drawing Sheets

METHOD FOR MANUFACTURING GRAPHENE NANO ARRAY AND FIELD-EFFECT TRANSISTOR INCLUDING THE SAME

CROSS-REFERENCE TO RELATED APPLICATION

This application claims priority to Korean Patent Application No. 10-2012-0101127 filed on 12 Sep., 2012 and all the benefits accruing therefrom under 35 U.S.C. §119, the contents of which are incorporated by reference in their entirety.

BACKGROUND

1. Technical Field

The present invention relates to a method for manufacturing a graphene nano array, and more particularly, to a method for manufacturing a nanoring array using nano imprint lithography.

2. Description of the Related Art

Graphene is a two-dimensional sheet of carbon atoms arranged in a honeycomb-shaped hexagonal lattice. Graphene has various advantages including structural/chemical stability, high optical transmittance of 90% or more, excellent electrical conductivity, excellent flexibility, and the like, and thus has been actively studied for application to various fields.

Generally, graphene can be obtained through exfoliation of one or more graphene sheets from bulk graphite. However, since a single layer of graphene has an energy band gap of '0', there are many difficulties in practical application of the graphene sheet to devices as a material for replacement of semiconductors.

Thus, various attempts have been made to develop physical and chemical methods for providing an energy band gap to graphene.

Among these, studies have been actively made to develop a method for forming graphene into a nano array such as an array of nanoribbons and the like. In this case, quantum confinement effects increase with decreasing line width of graphene, thereby providing the energy band gap to graphene.

In order to provide the band gap to graphene, electron beam lithography, ATM lithography (atomic force microscopy lithography), STM lithography (scanning tunneling microscopy lithography), and the like have been used. However, these processes require expensive equipment, thereby causing increase in cost and time for manufacturing the graphene.

In another method, dispersed graphite is pulverized into graphene nanoribbon particles having various line widths through centrifugation in order to provide an energy band gap to the graphene. However, this method cannot provide graphene nanoribbons arranged in a high density.

BRIEF SUMMARY

Therefore, the present invention is aimed at providing a method for manufacturing a large area graphene nano array having an open energy band gap at low cost.

One aspect of the present invention provides a method for manufacturing a graphene nano array. The method includes: preparing a substrate having a graphene sheet disposed thereon; sequentially forming a protective layer, a sacrificial layer and a resist layer on the graphene sheet; forming a hole pattern in a surface of the resist layer; etching the sacrificial layer and the protective layer along the hole pattern to form a trench such that a portion of the protective layer adjacent to the graphene sheet can remain; forming a metal layer of a nanocup pattern along a sidewall of the trench while rotating the trench; removing a lower surface of the metal layer to form a metal layer in a nanotube pattern; removing the resist layer and the sacrificial layer; etching the protective layer and the graphene sheet adjacent to the protective layer along the nanotube pattern; and removing the protective layer and the metal layer to form a graphene nano array.

The graphene nanoarray may include a plurality of graphene nanorings arranged therein.

The protective layer may be soluble in water and insoluble in a solvent for the sacrificial layer. The protective layer may be a PVA layer and the sacrificial layer may be a PMMA layer.

The forming a hole pattern in the resist layer may be performed by a nano imprint lithography process.

The remaining protective layer may have a thickness of 30 nm to 50 nm.

The etching the sacrificial layer and the protective layer along the hole pattern to form a trench may be performed using $O_2$ plasma.

The trench may be rotated at an angle of 30° to 50°.

The etching the protective layer and the graphene sheet along the nanotube pattern may be performed using $O_2$ plasma and may form an undercut through over-etching.

The method may further include heat treating the substrate after forming the graphene nano array.

Another aspect of the present invention provides a field-effect transistor having a graphene nano array. The transistor may include a gate electrode, a gate insulation layer placed on the gate electrode, graphene nanochannels placed on the gate insulation layer, and a source electrode and a drain electrode respectively contacting the graphene nanochannels. Here, the graphene nanochannels are graphene nanoring channels.

In the method according to the present invention, a graphene nano array may be manufactured at low cost through nano imprint lithography. In addition, a protective layer is formed on a graphene sheet to suppress generation of foreign matter remaining on the surface of the graphene sheet while preventing damage of the graphene sheet. Further, the graphene nano array may be easily manufactured to a large area and may be applied to channels of a field-effect transistor.

BRIEF DESCRIPTION OF THE DRAWINGS

The above and other aspects, features, and advantages of the present invention will become apparent from the detailed description of the following embodiments in conjunction with the accompanying drawings, in which.

DETAILED DESCRIPTION

Figure 1A:
FIG. 1a to FIG. 1k are sectional views of a method for manufacturing a graphene nano array in accordance with one embodiment of the present invention.

Exemplary embodiments of the present invention will now be described in detail with reference to the accompanying drawings. However, it should be understood that the present invention is not limited to the following embodiments and may be embodied in different ways by those skilled in the art without departing from the scope of the present invention. Further, it should be understood that various modifications and equivalent embodiments may be made by those skilled in the art without departing from the spirit and scope of the present invention.

It will be understood that when a layer is referred to as being "on" another layer or substrate, it can be directly formed on the other layer or substrate, or an intervening layer(s) may also be present. In addition, spatially relative terms, such as "above," "upper (portion)," "upper surface," and the like may be understood as meaning "below," "lower (portion)," "lower surface," and the like according to a reference orientation. In other words, the expressions of spatial orientations are to be construed as indicating relative orientations instead of absolute orientations.

In the drawings, the thicknesses of layers and regions can be exaggerated or omitted for clarity. The same components will be denoted by the same reference numerals throughout the specification.

FIG. 1a to FIG. 1k are sectional views of a method for manufacturing a graphene nano array in accordance with one embodiment of the present invention.

Figure 2:
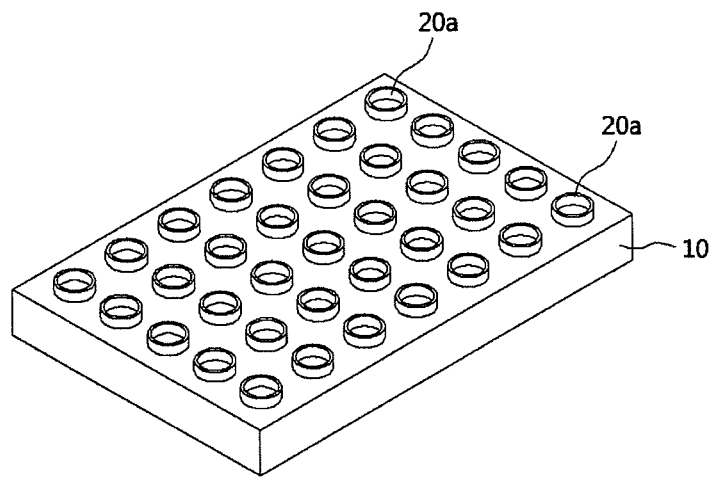
FIG. 2 is a perspective view of a graphene nano array manufactured by the method according to the embodiment of the present invention.

FIG. 2 is a perspective view of a graphene nano array manufactured by the method according to the embodiment of the present invention.

Referring to FIG. 1a, a substrate 10 having a graphene sheet 20 disposed thereon is prepared. In some embodiments, the substrate 10 may be a Si substrate including a $SiO_2$ layer, without being limited thereto.

The graphene sheet 20 may be formed on the substrate 10 via various methods. For example, the graphene sheet 20 may be formed by growing graphene on a catalyst layer via chemical vapor deposition (CVD) and transferring the graphene onto the substrate 10. Transfer of the graphene may be achieved by etching the catalyst layer using polydimethylsiloxane (PDMS) or polymethyl methacrylate (PMMA) as a support layer.

Figure 1B:
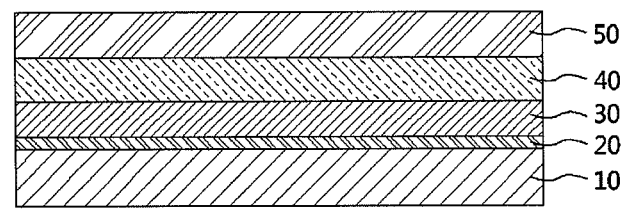

Referring to FIG. 1b, a protective layer 30, a sacrificial layer 40 and a resist layer 50 are sequentially formed on the graphene sheet 20. For example, the protective layer 30, sacrificial layer 40 and resist layer 50 may be formed by spin coating, without being limited thereto.

The protective layer 30 may be comprised of a water soluble material. Thus, the protective layer 30 can be removed using water as a solvent. In some embodiments, the protective layer 30 may be a polyvinyl alcohol (PVA) layer. However, the present invention is not limited thereto, and any water-soluble material may be used without limitation. The protective layer 30 may have a thickness of 100 nm to 200 nm.

The sacrificial layer 40 may be comprised of a material which can be dissolved in an organic solvent such as acetone, benzene, chloroform and the like. Thus, the sacrificial layer 40 can be removed using an organic solvent. The sacrificial layer 40 may contain a polymer material. In some embodiments, the sacrificial layer 30 may be a polymethyl methacrylate (PMMA) layer. However, the present invention is not limited thereto, and any material soluble in an organic solvent may be used without limitation. The sacrificial layer 40 may have a greater thickness than the protective layer 30. In some embodiments, the sacrificial layer 40 may have a thickness of 200 nm to 400 nm.

The resist layer 50 may be comprised of a material which can be cured upon UV irradiation. The resist layer 50 may contain a polymer material. In some embodiments, the resist layer 50 may be an SU-8 layer or a polydimethylsiloxane (PDMS) layer. The resist layer 50 may have a thickness of 10 nm to 100 nm.

Figure 1C:
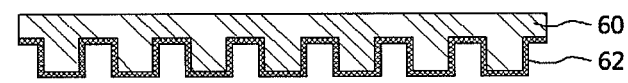
Figure 1D:
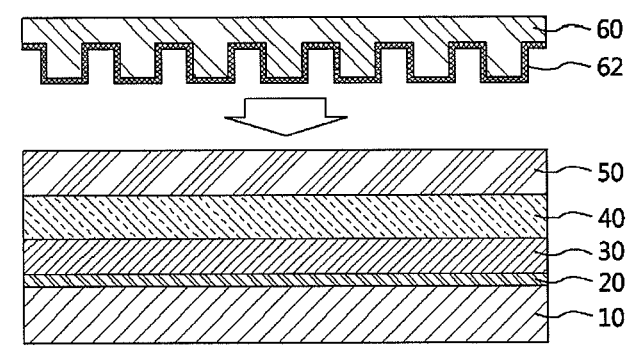
Figure 1E:
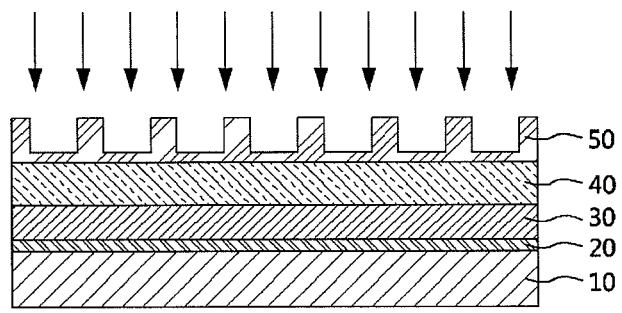

Referring to FIG. 1c and FIG. 1e, a hole pattern is formed in a surface of the resist layer 50. In one embodiment, the hole pattern may be formed through nano imprint lithography.

More specifically, an imprinting stamp 60 having a plurality of pillars may be manufactured. In one embodiment, the imprinting stamp 60 may be a soft stamp comprised of a polymer material such as PDMS (polydimethylsiloxane) and the like. Alternatively, the imprinting stamp 60 may be a hard stamp comprised of glass, Si, or the like. At this time, the soft stamp or the hard stamp may have a pattern replicated from a master stamp having an opposite pattern on the surface thereof.

Then, the resist layer 50 is pressed by the imprinting stamp 60 and the resist layer 50 is cured by UV irradiation, followed by removing the imprinting stamp 60. Upon UV irradiation, a pattern corresponding to the pattern of the stamp 60 may be formed in the surface of the resist layer 50 while the resist layer 50 is cured.

At this time, before the resist layer 50 is pressed by the imprinting stamp 60, an anti-sticking self-assembled monolayer 62 may be formed on the surface of the imprinting stamp 60. The anti-sticking self-assembled monolayer 62 of the imprinting stamp 60 may facilitate removal of the imprinting stamp 60 from the resist layer 50.

The imprinted pattern on the surface of the resist layer 50 may be a hole pattern. At this time, the hole pattern may be transferred to a lower surface of the resist layer 50 via reactive ion etching. Specifically, the hole pattern may be formed as vertical pores passing through the resist layer 50 via reactive ion etching. In some embodiments, the reactive ion etching may be $CF_4$ plasma etching.

Figure 1F:
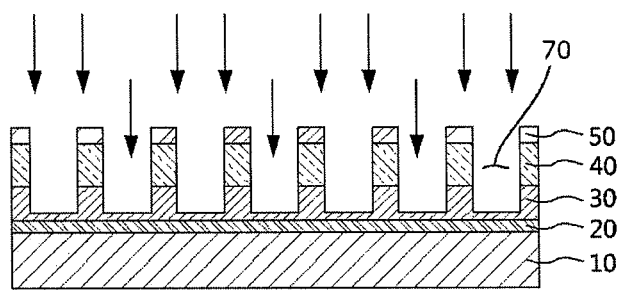

Referring to FIG. 1f, a trench 70 is formed by etching the sacrificial layer 40 and the protective layer 30 along the hole pattern formed in the surface of the resist layer 50. Here, the etching may be $O_2$ plasma etching.

The aspect ratio of the trench 70 significantly affects the formation of a metal layer 80 described below. Thus, the sacrificial layer 40 desirably has a small thickness so as to compensate for the small thickness of the protective layer 30. In some embodiments, the protective layer 30 and the sacrificial layer 40 may be formed to have a thickness difference of 100 nm or more therebetween.

Here, etching may be performed to allow a portion 30a of the protective layer adjacent to the graphene sheet 20 to remain. The remaining protective layer 30a may have a thickness of 30 nm to 50 nm.

As a result, the graphene sheet 20 is not exposed, thereby reducing a possibility of foreign matter remaining on the surface of the graphene sheet 20.

Figure 1G:
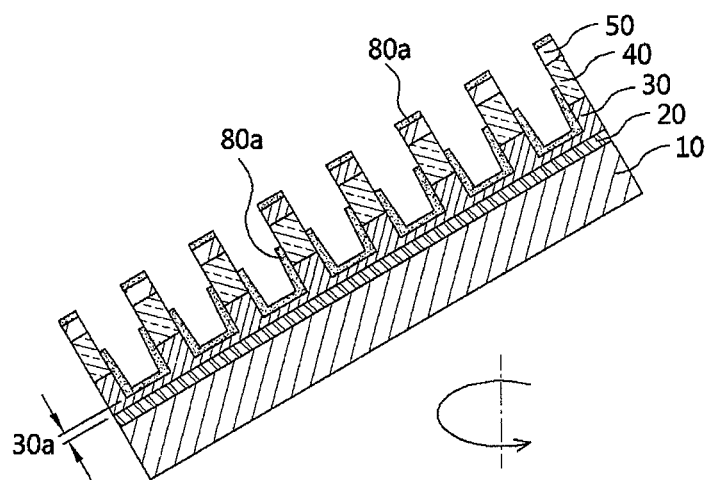

Referring to FIG. 1g, the metal layer 80 is formed within the trench 70. The metal layer 80 may be formed by sputtering. In some embodiments, the metal layer 80 may be formed along sidewalls of the trench 70 by rotating the trench 70 to a certain degree. Here, the trench may be rotated an angle of 30 to 50 degrees with respect to a horizontal surface. As such, the metal layer 80 having a nanocup pattern may be formed along the sidewalls of the trench 70.

The metal layer 80 may be comprised of aluminum (Al), tungsten (W), copper (Cu), nickel (Ni), chromium (Cr), molybdenum (Mo), titanium (Ti), platinum (Pt), or tantalum (Ta).

Figure 1H:
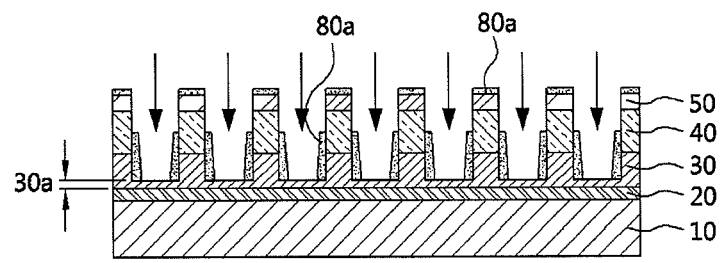

Referring to FIG. 1h, a lower surface 80b of the metal layer 80 is removed to form a metal layer 80a in a nanotube pattern. Here, Ar plasma etching is performed to remove the lower surface 80b of the metal layer 80. As a result, the protective layer 30a disposed at a lower portion of the metal layer 80 may be exposed.

In some embodiments, anisotropic Ar plasma etching may be performed at a plasma power of about 300 W. In this case, the protective layer 30a placed at the lower portion of the metal layer 80 may prevent damage of the graphene sheet 20.

Further, the protective layer 30a may prevent the metal layer 80a of the nanotube pattern from being disrupted by Ar ions of high energy scattered backwards on the surface of the substrate 10.

Figure 1I:
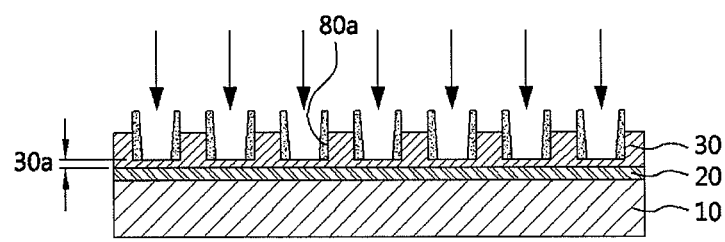

Referring to FIG. 1i, the sacrificial layer 40 and the resist layer 50 are removed. In some embodiments, the sacrificial layer 40 and the resist layer 50 may be removed by a lift-off process. The lift-off process may be performed using acetone as a solvent, without being limited thereto.

Figure 1J:
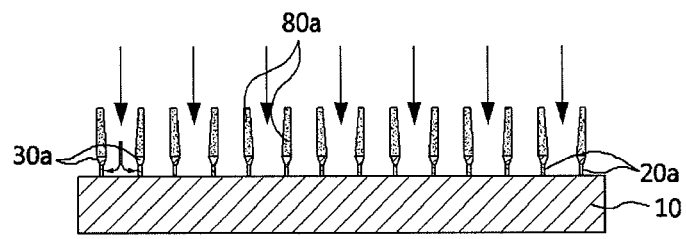

Referring to FIG. 1j, the protective layer 30 and the graphene sheet 20 under the protective layer 30 are etched along the nanotube pattern of the metal layer 80a. Specifically, the protective layer 30 and the graphene sheet 20 may be subjected to etching through the metal layer 80a used as a mask. As a result, the graphene sheet 20 may be etched into a nanoring shape.

Here, the etching may be $O_2$ plasma etching. At this time, since a thinner protective layer 30a is placed within the nanotube pattern, undercut can occur due to over-etching under the nanotube pattern. Thus, a nanoring pattern having a thinner line width than that of the nanotube pattern may be formed on the graphene sheet 20.

To obtain an optimized energy band gap, the nanoring pattern may have a line width of 15 nm or less.

Figure 1K:
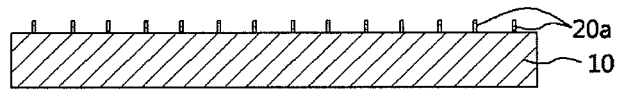

Referring to FIG. 1k and FIG. 2, a graphene nano array 20a is formed by removing the protective layer 30 and the metal layer 80a. The protective layer 30 and the metal layer 80a may be removed by the lift-off process. The lift-off process may be performed using water as a solvent, without being limited thereto.

Then, the substrate 10 having the graphene nano array 20a formed thereon may be subjected to heat treatment. Heat treatment may remove remaining organic matter or moisture from the substrate. In some embodiments, heat treatment may be performed using a CVD system.

Next, the present invention will be described with reference to examples. However, it should be understood that these examples are provided for illustration only and are not intended to limit the scope of the present invention.

EXPERIMENTAL EXAMPLE

1. Preparation of Imprinting Stamp

An imprinting stamp was prepared through laser interference lithography using a 325 nm He—Cd laser and dry etching. The stamp was formed with pillars having a diameter of 240 nm and periodically arranged at a pitch of 450 nm. An anti-sticking self-assembled monolayer was deposited on the surface of the stamp to act as an adhesion preventing layer.

2. Formation of Single Graphene Sheet on $SiO_2$/Si Substrate

In order to grow graphene, a Cu/Ni film was formed on a $SiO_2$/Si substrate having a 300 nm thick $SiO_2$ layer via electron-beam deposition, and the substrate was placed within an ICP-CVD chamber. At an initial pressure of $5\times10^{-7}$ Torr, the substrate was heated from room temperature to 650° C. The substrate was subjected to cleaning with an RF plasma source in a hydrogen atmosphere, followed by growing graphene using a mixture of Ar and $C_2H_2$ at a plasma power of 100 W for 3 minutes. After cooling, the graphene sheet grown on the substrate was transferred to another $SiO_2$/Si substrate having a 300 nm thick $SiO_2$ layer to form a graphene sheet on the $SiO_2$/Si substrate.

3. Nano Imprint Lithography

With the graphene sheet formed on the $SiO_2$/Si substrate, a polyvinyl alcohol (PVA) layer and a polymethyl methacrylate (PMMA) layer were sequentially formed thereon. At this time, the PVA layer was formed by spin coating at 4000 rpm for 30 seconds, followed by heat treatment at 100° C. for 20 seconds, and the PMMA layer was formed by spin coating at 2000 rpm for 40 seconds, followed by heat treatment at 100° C. for 2 minutes. Then, an imprint resist layer was formed on the PMMA layer. The imprint resist layer was formed by spin coating a mixture of 87% of UV curable diethylsiloxane (Gelest), 3% of a radical initiator (Irgacure 184, Ciba), and 10% of ethylene glycol dimethacrylate as a crosslinking agent (Aldrich) at 6500 rpm for 150 seconds. Then, a hole pattern was formed on the imprint resist layer using the imprint stamp prepared in Step 1. At this time, imprinting was carried out under a pressure of $5.2\times10^3$ Torr by UV irradiation for 10 minutes. Then, the imprint stamp was removed and remainders were removed from the holes using $CF_4$ plasma (50 sccm, 20 mTorr, 20 W, 30 sec.).

4. Metal Deposition and Formation of Nanoring Array

The hole pattern formed on the imprint resist layer in Step 3 was transferred onto the PVA layer and the PMMA layer using $O_2$ plasma (50 sccm, 20 mTorr, 20 W, 210 sec.). At this time, $O_2$ plasma processing was performed until the remaining PVA had a thickness of 30 nm. Then, Ni was deposited into a nanocup shape thereon by DC sputtering at a rate of 0.2 nm/s under a pressure of $10^{-6}$ Torr while rotating the sample at an angle of 45° at a speed of 15 rpm. The Ni nanocups were changed into Ni nanotubes by removing Ni on the bottom surface through anisotropic high energy Ar ion bombardment (50 sccm, 10 mTorr, 100 W~300 W, 20 sec.). Then, the PMMA layer was lifted-off through acetone ultrasonication in a mild atmosphere so as to allow only the PVA layer to surround the Ni nanotubes. The width of the Ni sidewall was transferred to the graphene sheet by $O_2$ plasma (50 sccm, 20 mTorr, 25 W, 100 sec.). Then, the resultant was dipped in water to lift-off the PVA layer. Next, the substrate having a nanoring array formed thereon was subjected to cleaning in acetone/IPA and annealed in a CVD system under conditions of 4 Torr, $H_2$ of 100 sccm, Ar of 10 sccm, and 400° C. for 1 hour, thereby forming the nanoring array.

Figure 3:
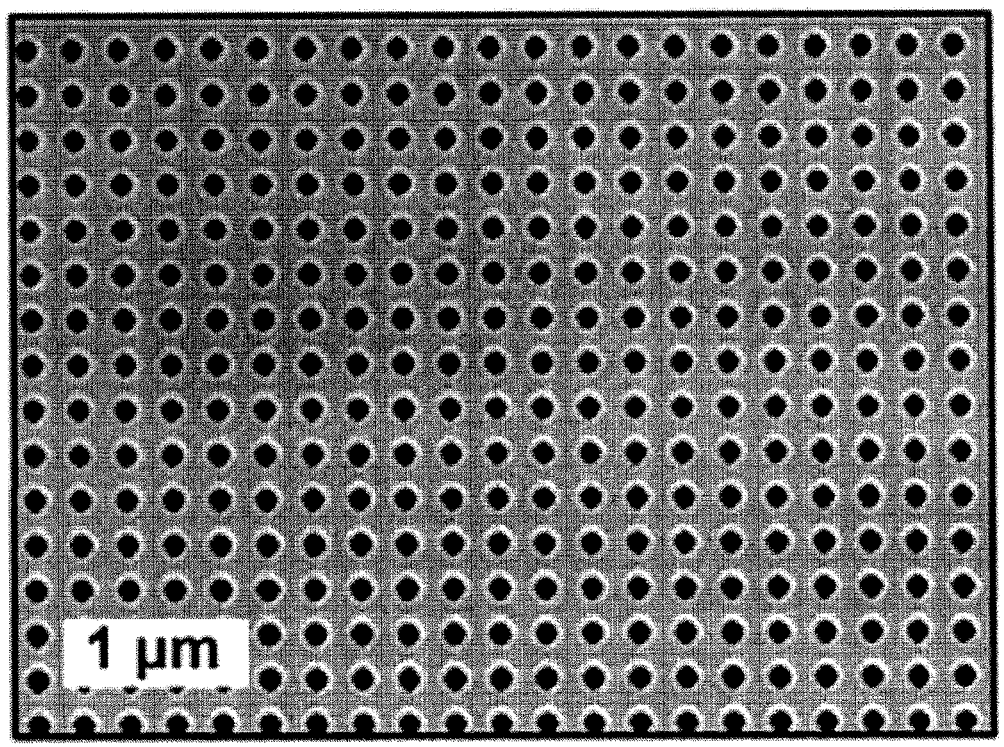
FIG. 3 is an SEM image of a nano imprint pattern after a process of FIG. 1e.

FIG. 3 is an SEM image of a nano imprint pattern after the process of FIG. 1e

Referring to FIG. 3, it can be seen that the hole pattern corresponding to the pattern of the imprinting stamp was formed on the resist layer. The hole pattern consists of holes having a diameter of 240 nm and arranged at a pitch of 450 nm.

Figure 4:
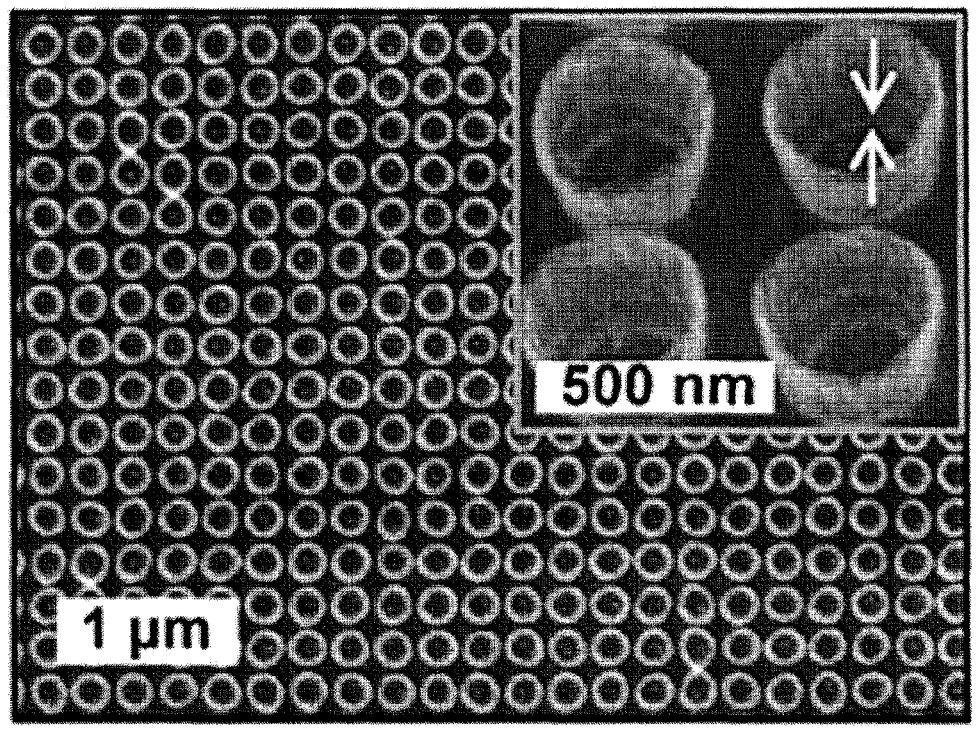
FIG. 4 is an SEM image of a metal layer nanotube pattern after a process of FIG. 1h.

FIG. 4 is an SEM image of a metal layer nanotube pattern after the process of FIG. 1h Referring to FIG. 4, it can be seen that the Ni nanotube pattern was formed by removing Ni of the bottom surface from Ni deposited in the form of the nanocup shape. The Ni nanotube pattern was formed over an imprinting area of about 3 cm×3 cm. It can be seen that the diameter of the Ni nanotubes was increased to 300 nm from an initial hole diameter of 240 nm during transfer of the hole pattern through dry etching. However, the number of nanotubes in each array was not changed. The sidewall of each of the nanotubes has a height of about 250 nm and a width of about 20 nm.

In addition, in an enlarged view of an array of four nanotubes, there was no change in fundamental arrangement of the nanotube pattern. Thus, it can be seen that the nanocup shape was changed into the nanotube shape without destroying the fundamental arrangement when using Ar ion bombardment.

Figure 5A:
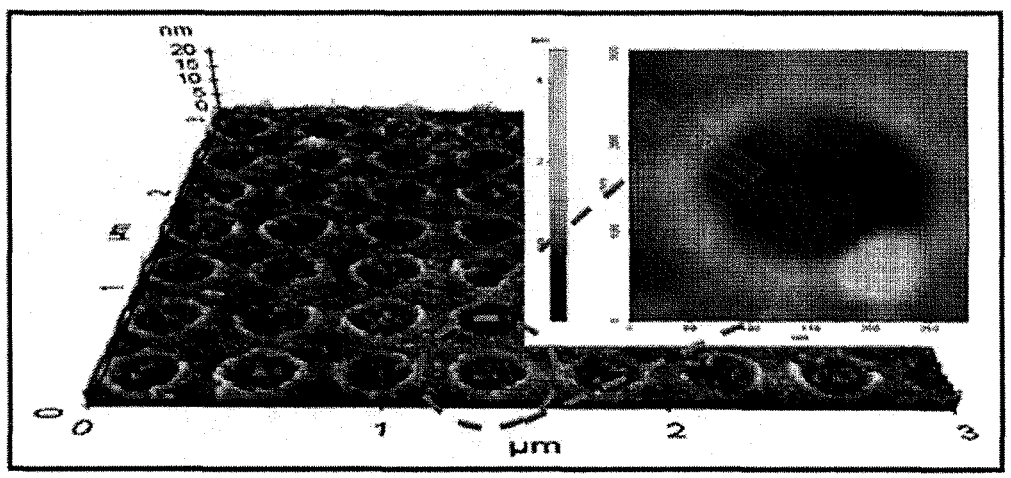
FIG. 5a and FIG. 5b are an AFM image and a graph depicting a surface profile of one example of the graphene nano array manufactured by the method according to the embodiment of the present invention.
Figure 5B:
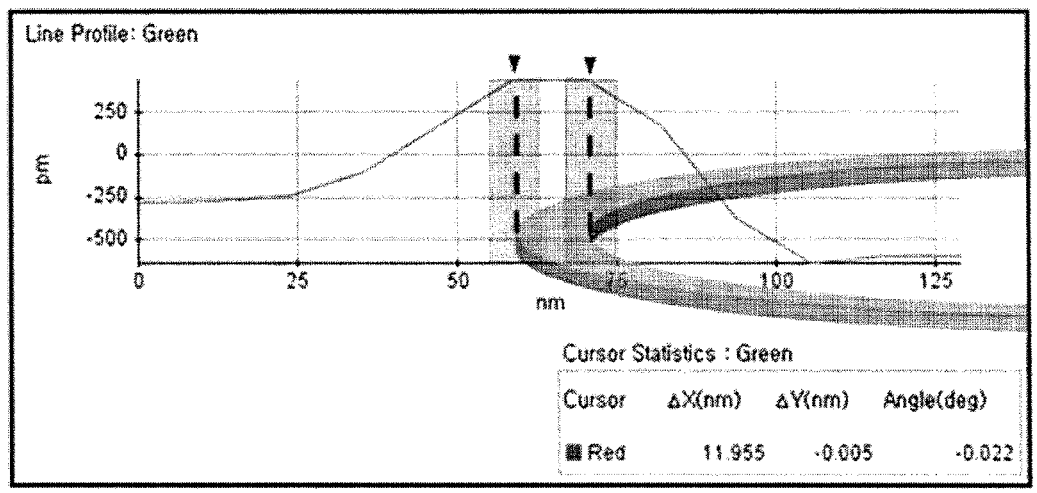

FIG. 5a and FIG. 5b are an AFM image and a graph depicting a surface profile of one example of the graphene nano array manufactured by the method according to the embodiment of the present invention.

Referring to FIG. 5a and FIG. 5b, it can be seen that graphene was regularly arranged in the form of a nanoring array. The area of the nanoring array was ½ that of the Ni nanotube array. Each of the graphene nanorings had a thickness of about 0.7 nm. Thus, it can be seen that graphene nanorings similar to nanoribbons were formed. Further, the graphene nanorings had a line width of 12 nm.

In the surface profile of the substrate on which the graphene nanorings were formed, it can be seen that the $SiO_2$ substrate was etched to a depth of 1 nm from the graphene nanorings in a region inside the graphene nanorings and etched to a depth of 0.7 nm in a region outside the graphene nanorings. It is estimated that this result was obtained due to thickness difference in the PVA layer removed by $O_2$ plasma etching between these regions upon anisotropic etching. Since the thin PVA layer inside the graphene nanorings was initially removed by etching, the $SiO_2$ substrate under the graphene nanorings was exposed and subjected to ion bombardment. As a result, the $SiO_2$ substrate had a rougher surface profile and a higher etching depth.

Figure 6:
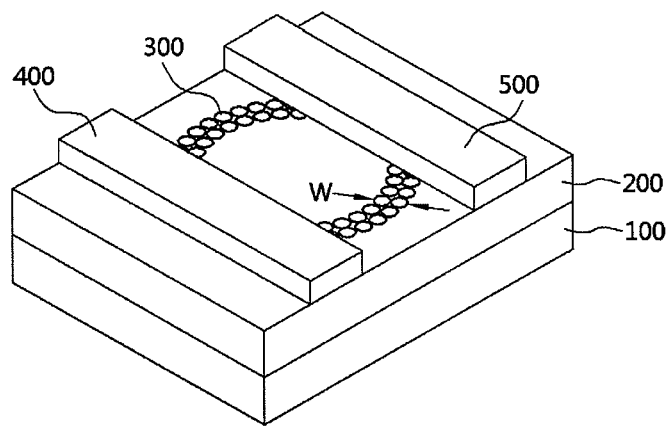
FIG. 6 is a perspective view of a field-effect transistor having a graphene nano array manufactured by the method according to the embodiment of the present invention.

FIG. 6 is a perspective view of a field-effect transistor having a graphene nano array manufactured by the method according to the embodiment of the present invention.

Referring to FIG. 6, a gate electrode 100 is disposed. In some embodiments, the gate electrode 100 may be a p-type Si electrode. The gate electrode 100 may also act as a substrate.

A gate insulation layer 200 is placed on the gate electrode 100. The gate insulation layer 200 may be formed on an upper surface of the gate electrode 100. The gate insulation layer 200 may be an inorganic insulation layer. For example, the gate insulation layer 200 may be a silicon nitride layer ($SiN_x$) or a silicon oxide layer ($SiO_2$).

A graphene nano array channel 300 is placed on the gate insulation layer 200. The nano array channel 300 may be an array of graphene nanorings. The graphene nano array channel 300 may have a width (W) of 15 nm or less.

A source electrode 400 is separated from a drain electrode 500 on the graphene nano array channel 300. Each of the source electrode 400 and the drain electrode 500 may contact the graphene nano array channel 300.

The source electrode 400 and the drain electrode 500 may be formed of a conductive material. The conductive material may be metal having low resistance. In some embodiments, the metal may be selected from among aluminum (Al), tungsten (W), copper (Cu), nickel (Ni), chromium (Cr), molybdenum (Mo), titanium (Ti), platinum (Pt), and tantalum (Ta), without being limited thereto.

Although FIG. 6 shows a graphene field-effect transistor adopting a bottom gate structure, the present invention is not limited thereto, and may be applied to a graphene field-effect transistor adopting a top gate structure, in which a gate electrode is formed on the top thereof.

Although some embodiments have been described herein, it should be understood by those skilled in the art that these embodiments are given by way of illustration only, and that various modifications, variations and alterations can be made without departing from the spirit and scope of the invention.

What is claimed is:

1. A method for manufacturing a graphene nano array, comprising:
   preparing a substrate having a graphene sheet disposed thereon;
   sequentially forming a protective layer, a sacrificial layer and a resist layer on the graphene sheet;
   forming a hole pattern in a surface of the resist layer;
   etching the sacrificial layer and the protective layer along the hole pattern to form a trench such that a portion of the protective layer adjacent to the graphene sheet remains;
   forming a metal layer of a nanocup pattern along a sidewall of the trench while rotating the trench;
   removing a lower surface of the metal layer to form a metal layer in a nanotube pattern;
   removing the resist layer and the sacrificial layer;
   etching the protective layer and the graphene sheet adjacent to the protective layer along the nanotube pattern; and
   removing the protective layer and the metal layer to form a graphene nano array.

2. The method according to claim 1, wherein the graphene nano array comprises a plurality of graphene nanorings arranged therein.

3. The method according to claim 1, wherein the protective layer is soluble in water and insoluble in a solvent for the sacrificial layer.

4. The method according to claim 1, wherein the protective layer is a PVA layer and the sacrificial layer is a PMMA layer.

5. The method according to claim 1, wherein the forming a hole pattern in the resist layer is performed using a nano imprint lithography process.

6. The method according to claim 1, wherein the remaining protective layer has a thickness of 30 nm to 50 nm.

7. The method according to claim 1, wherein the etching the sacrificial layer and the protective layer along the hole pattern to form a trench is performed using $O_2$ plasma.

8. The method according to claim 1, wherein the trench is rotated at an angle of 30° to 50°.

9. The method according to claim 1, wherein the etching the protective layer and the graphene sheet along the nanotube pattern is performed using $O_2$ plasma and forms an undercut through over-etching.

10. The method according to claim 1, further comprising: heat treating the substrate after forming the graphene nano array.

* * * * *